United States Patent
Li et al.

(10) Patent No.: US 12,428,722 B2
(45) Date of Patent: Sep. 30, 2025

(54) COMPOSITIONS AND METHODS USING SAME FOR DEPOSITION OF SILICON-CONTAINING FILM

(71) Applicant: VERSUM MATERIALS US, LLC, Tempe, AZ (US)

(72) Inventors: Jianheng Li, Tempe, AZ (US); Xinjian Lei, Tempe, AZ (US); Raymond Nicholas Vrtis, Tempe, AZ (US); Robert Gordon Ridgeway, Tempe, AZ (US); Dino Sinatore, Tempe, AZ (US); Manchao Xiao, Tempe, AZ (US)

(73) Assignee: Versum Materials US, LLC, Tempe, AZ (US)

( * ) Notice: Subject to any disclaimer, the term of this patent is extended or adjusted under 35 U.S.C. 154(b) by 38 days.

(21) Appl. No.: 16/079,672

(22) PCT Filed: Feb. 22, 2017

(86) PCT No.: PCT/US2017/018873
§ 371 (c)(1),
(2) Date: Aug. 24, 2018

(87) PCT Pub. No.: WO2017/147150
PCT Pub. Date: Aug. 31, 2017

(65) Prior Publication Data
US 2019/0055645 A1 Feb. 21, 2019

Related U.S. Application Data

(60) Provisional application No. 62/300,312, filed on Feb. 26, 2016.

(51) Int. Cl.
*C23C 16/32* (2006.01)
*C23C 16/36* (2006.01)
(Continued)

(52) U.S. Cl.
CPC ............ *C23C 16/325* (2013.01); *C23C 16/36* (2013.01); *C23C 16/505* (2013.01);
(Continued)

(58) Field of Classification Search
CPC ... C23C 16/325; C23C 16/505; C23C 16/513; C23C 16/36; C23C 16/45553;
(Continued)

(56) References Cited

U.S. PATENT DOCUMENTS 7,091,137 B2    8/2006   Lee et al.
7,438,760 B2    10/2008   Bauer et al.
(Continued)

FOREIGN PATENT DOCUMENTS

EP    2048699 A2    4/2009
EP    2620440 A1    7/2013
(Continued)

OTHER PUBLICATIONS

International Search Report and Written Opinion mailed May 10, 2017 by the Korean Intellectual Property Office for counterpart international patent application No. PCT/US2017/018873.

*Primary Examiner* — Michael G Miller
(74) *Attorney, Agent, or Firm* — Daniel Roth; Versum Materials US, LLC

(57) ABSTRACT

Described herein are compositions and methods using same for forming a silicon-containing film such as without limitation a silicon carbide, silicon nitride, silicon oxide, silicon oxynitride, a carbon-doped silicon nitride, a carbon-doped silicon oxide, or a carbon doped silicon oxynitride film on at least a surface of a substrate having a surface feature. In one aspect, the silicon-containing films are deposited using the co-deposition of a first compound comprising a carbon-carbon double or carbon-carbon triple bond and a second compound comprising at least one Si—H bond.

15 Claims, 8 Drawing Sheets

(51) Int. Cl.
*C23C 16/455* (2006.01)
*C23C 16/505* (2006.01)
*C23C 16/513* (2006.01)
*H01L 21/02* (2006.01)

(52) U.S. Cl.
CPC ...... *C23C 16/513* (2013.01); *H01L 21/02167* (2013.01); *H01L 21/02211* (2013.01); *H01L 21/02219* (2013.01); *H01L 21/02222* (2013.01); *H01L 21/02274* (2013.01); *C23C 16/45553* (2013.01)

(58) Field of Classification Search
CPC ... C23C 16/308; C23C 16/345; C23C 16/401; C23C 16/56; H01L 21/02219; H01L 21/02222; H01L 21/02167; H01L 21/02211; H01L 21/02274
See application file for complete search history.

(56) References Cited

U.S. PATENT DOCUMENTS

| | | | |
|---|---|---|---|
| 7,521,378 | B2 | 4/2009 | Fucsko et al. |
| 7,622,162 | B1 | 11/2009 | van Schravendijk et al. |
| 7,662,730 | B2 | 2/2010 | Chen et al. |
| 7,825,040 | B1 | 11/2010 | Fukazawa et al. |
| 8,575,040 | B2 | 11/2013 | Fucsko et al. |
| 8,846,536 | B2 | 9/2014 | Draeger et al. |
| 8,889,566 | B2 | 11/2014 | Chatterjee et al. |
| 2003/0049388 | A1* | 3/2003 | Cho ................ C23C 16/507 118/712 |
| 2004/0126929 | A1 | 7/2004 | Tang et al. |
| 2005/0109276 | A1 | 5/2005 | Iyer et al. |
| 2008/0251926 | A1* | 10/2008 | Tada ................ C09D 4/00 257/759 |
| 2008/0305648 | A1 | 12/2008 | Fukazawa et al. |
| 2010/0081293 | A1 | 4/2010 | Mallick et al. |
| 2010/0233886 | A1 | 9/2010 | Yang et al. |
| 2011/0204382 | A1 | 8/2011 | Traut et al. |
| 2012/0009413 | A1 | 1/2012 | Menezes et al. |
| 2013/0217240 | A1* | 8/2013 | Mallick ............ H01L 21/02211 438/778 |
| 2013/0217241 | A1 | 8/2013 | Underwood et al. |
| 2013/0230987 | A1* | 9/2013 | Draeger ............ H01L 21/02274 438/694 |
| 2013/0243968 | A1 | 9/2013 | Xiao et al. |
| 2013/0267079 | A1 | 10/2013 | Underwood et al. |
| 2013/0330482 | A1* | 12/2013 | Leu ................ C23C 16/345 427/579 |
| 2014/0030448 | A1 | 1/2014 | Bowen et al. |
| 2014/0073144 | A1* | 3/2014 | Chatterjee ........ H01L 21/02167 438/778 |
| 2014/0272194 | A1 | 9/2014 | Xiao et al. |
| 2014/0302688 | A1* | 10/2014 | Underwood ...... H01L 21/02208 438/786 |
| 2015/0099375 | A1 | 4/2015 | Haripin et al. |
| 2015/0115411 | A1 | 4/2015 | Ozaki et al. |
| 2015/0376211 | A1 | 12/2015 | Girard et al. |
| 2016/0079034 | A1* | 3/2016 | Yieh ................ H01L 21/02271 427/523 |

FOREIGN PATENT DOCUMENTS

| | | |
|---|---|---|
| EP | 2639331 A2 | 9/2013 |
| EP | 2743272 A1 | 6/2014 |
| JP | 61149226 A | 7/1986 |
| JP | S61149226 A | 7/1986 |
| JP | 2012160647 A | 8/2012 |
| WO | 2009055340 | 4/2009 |
| WO | 2009055340 A1 | 4/2009 |

* cited by examiner

COMPOSITIONS AND METHODS USING SAME FOR DEPOSITION OF SILICON-CONTAINING FILM

This application claims the benefit of Application No. 62/300,312, filed on Feb. 26, 2016. The disclosure of Application No. 62/300,312 is hereby incorporated by reference.

FIELD OF THE INVENTION

Described herein is a process for the fabrication of an electronic device. More specifically, described herein are compositions for forming a silicon-containing film in a deposition process, such as, without limitation, a flowable chemical vapor deposition. Exemplary silicon-containing films that can be deposited using the compositions and methods described herein include, without limitation, silicon oxide, silicon nitride, silicon carbide, silicon oxynitride or carbon-doped silicon oxide or carbon-doped silicon nitride films.

BACKGROUND OF THE INVENTION

US Publ. No. 2013/0217241 discloses the deposition and treatment of Si—C—N containing flowable layers. Si and C may come from a Si—C-containing precursor, while N may come from an N-containing precursor. The initial Si—C—N containing flowable layer is treated to remove components that enables the flowability. Removal of these components can increase etch tolerance, reduce shrinkage, adjust film tension and electrical properties. The post treatment can be thermal annealing, UV exposure or high density plasma.

U.S. Pat. No. 8,889,566 discloses a method to deposit flowable film by exciting the silicon precursor with a local plasma and depositing with a second plasma. The silicon precursor can be silylamine, higher order silane or halogenated silane. The second reactant gas can be $NH_3$, $N_2$, $H_2$, and/or $O_2$.

U.S. Pat. No. 7,825,040 discloses a method of filling a gap by introducing an alkoxysilane or aminosilane precursor, and depositing a flowable Si-containing film by plasma reaction. The precursor doesn't contain a Si—C bond or a C—C bond.

U.S. Pat. Nos. 8,889,566, 7,521,378, and 8,575,040 describe an approach to depositing a silicon oxide film using flowable chemical vapor deposition process is gas phase polymerization. Compounds such as trisilylamine (TSA) was used to deposit Si, H, and N containing oligomers that were subsequently oxidized to $SiO_x$ films using ozone exposure.

U.S. Pat. No. 8,846,536 discloses a method to deposit and modify the flowable dielectric film. By one or more integration processes, the wet etch rate of the flowable dielectric film can be changed by a factor of at least 10.

The disclosure of the previously identified patents and patent applications is hereby incorporated by reference.

Despite the recent activity in the art related to flowable chemical vapor deposition and other film deposition processes, problems still remain. One of these problems is related to film stress and voiding. Flowable films are mostly deposited at a lower temperature, the high temperature and high energy post treatment leads to high film stress and creates voids in the features. Lowering the wet etch rate has been challenging due to the low film quality at low process temperature. Thus there is a need to provide alternative precursor compounds, precursor combinations, or modified techniques, or a combination thereof.

BRIEF SUMMARY OF THE INVENTION

The compositions or formulations described herein and methods using same overcome the problems of the prior art by depositing a silicon-containing film on at least a portion of the substrate surface that provides desirable film properties upon post-deposition treatment. The inventive compositions and methods can provide a silicon-containing film having the following characteristics: i) a film tensile stress, as measured using a Toho stress tool, ranging from about 10 to about 20 MPa after a thermal cure and ranging from about 150 to about 190 MPa after a UV cure, and ii) a density, as measured by X-Ray reflectance ranging from about 1.35 to about 2.10 $g/cm^3$.

The silicon-containing film is selected from the group consisting of a silicon nitride, a silicon carbide, a silicon oxide, a carbon-doped silicon nitride, a silicon oxynitride, and a carbon-doped silicon oxynitride film. In certain embodiments, the substrate comprises a surface feature. The term "surface feature", as used herein, means that the substrate or partially fabricated substrate that comprises one or more of the following pores, trenches, shallow trench isolation (STI), vias, reentrant feature, or the like. The compositions can be pre-mixed compositions, pre-mixtures (mixed before being used in the deposition process), or in-situ mixtures (mixed during the deposition process). Thus, in this disclosure the terms "mixture", "formulation", and "composition" are interchangeable.

In one aspect, there is provided a method for depositing a silicon-containing film, the method comprising:
  placing a substrate comprising a surface feature into a reactor which is at one or more temperatures ranging from −20° C. to about 400° C.;
  introducing into the reactor a first compound having at least one carbon-carbon double bond or carbon-carbon triple bonds wherein the at least one first compound having the formula $R_nSiR^1_{4-n}$ wherein R is selected a linear or branched $C_2$ to $C_6$ alkenyl group, a linear or branched, $C_2$ to $C_6$ alkynyl group; $R^1$ is selected from hydrogen and a branched $C_1$ to $C_{10}$ alkyl group; and n is a number selected from 0, 1, 2, 3;
  introducing into the reactor the second compound having at least one Si—H bond wherein the at least one second compound is selected from the group consisting of the following Formula IIA to IIH and IIIA:
  IIA. a polysilane compound having a formula of $Si_xH_{2x+2}$ wherein x is a number from 2 to 6;
  IIB. a compound having the formula $R^1_mSiH_{4-m}$ wherein $R^1$ is selected from hydrogen and a linear or branched $C_1$ to $C_{10}$ alkyl group; and m is a number selected from 1, 2 and 3;
  IIC. a compound having the formula $SiH_3$—$R^2$—$SiH_3$ wherein $R^2$ is a linear or branched $C_1$ to $C_6$ alkylene group;
  IID. a compound having the formula $R^3SiH_2$—$R^2$—$SiH_2R^4$ wherein $R^2$ is a linear or branched $C_1$ to $C_6$ alkylene group; $R^3$ is selected from hydrogen, a linear or branched $C_1$ to $C_{10}$ alkyl group, and a $C_4$ to $C_{10}$ aryl group; and $R^4$ is selected from a linear branched $C_1$ to $C_{10}$ alkyl group;
  IIE. a compound having the formula $(R^3R^4N)_nSiH_{3-n}R^1$ wherein $R^1$ is selected from hydrogen and a branched $C_1$ to $C_{10}$ alkyl group; $R^3$ is selected from hydrogen, a branched $C_1$ to $C_{10}$ alkyl group, and a $C_4$ to $C_{10}$ aryl group; and $R^4$ is selected from a linear or branched $C_1$ to $C_{10}$ alkyl group;

IIF. a silacycloalkyl compound;

IIG. a trisilylamine compound or derivatives thereof;

IIH. a silazane compound having the formula of $[(R^3R^4N)_p\ SiH_{3-p}]_2NR^1$ or $[R^3_pSiH_{2-p}NR^1]_q$ wherein $R^1$ is selected from hydrogen and a linear or branched $C_1$ to $C_{10}$ alkyl group; $R^3$ is selected from hydrogen, a linear or branched $C_1$ to $C_{10}$ alkyl group, and a $C_4$ to $C_{10}$ aryl group; and $R^4$ is selected from a linear or branched $C_1$ to $C_{10}$ alkyl group; p=0, 1, 2; q=2 or 3;

IIIA. An organoaminodisilanes having the formula of $(R^3R^4N)SiH_2SiH_3$ wherein $R^3$ is selected from hydrogen, a branched $C_1$ to $C_{10}$ alkyl group, and a $C_4$ to $C_{10}$ aryl group; and $R^4$ is selected from a linear or branched $C_1$ to $C_{10}$ alkyl group; In some embodiments, $R^3$ and $R^4$ can be linked to form a ring; In other embodiments, $R^3$ and $R^4$ are not linked to form a ring; and providing a plasma source into the reactor to at least partially react the first and second compounds to form a flowable liquid or oligomer wherein the flowable liquid or oligomer at least partially fills a portion of the surface feature.

In one particular embodiment, the plasma source is selected from but not limited to the group consisting of a nitrogen plasma; plasma comprising nitrogen and helium; a plasma comprising nitrogen and argon; an ammonia plasma; a plasma comprising ammonia and helium; a plasma comprising ammonia and argon; helium plasma; argon plasma; hydrogen plasma; a plasma comprising hydrogen and helium; a plasma comprising hydrogen and argon; a plasma comprising ammonia and hydrogen; an organic amine plasma; a plasma comprising oxygen; a plasma comprising oxygen and hydrogen, and mixtures thereof.

In another embodiment, the plasma source is selected from but not limited to the group consisting of a carbon source plasma, including a hydrocarbon plasma, a plasma comprising hydrocarbon and helium, a plasma comprising hydrocarbon and argon, carbon dioxide plasma, carbon monoxide plasma, a plasma comprising hydrocarbon and hydrogen, a plasma comprising hydrocarbon and a nitrogen source, a plasma comprising hydrocarbon and an oxygen source, and mixture thereof.

In any of the above or in an alternative embodiment, the flowable liquid or oligomer is treated at one or more temperatures ranging from about 100° C. to about 1000° C. to densify at least a portion of the materials.

In some embodiment, the post thermal treatment materials are exposed to a plasma, infrared lights, chemical treatment, an electron beam, or UV light to form a dense film.

The above steps define one cycle for the methods described herein; and the cycle can be repeated until the desired thickness of a silicon-containing film is obtained. In this or other embodiments, it is understood that the steps of the methods described herein may be performed in a variety of orders, may be performed sequentially or concurrently (e.g., during at least a portion of another step), and any combination thereof. The respective step of supplying the compounds and other reagents may be performed by varying the duration of the time for supplying them to change the stoichiometric composition of the resulting silicon-containing film.

One embodiment of the invention relates to a chemical precursor for forming a silicon containing film comprising at least two compounds wherein a first compound comprises at least one member selected from the group consisting of compounds having at least one carbon-carbon double bond or C—C triple bond wherein the compound is represented by the formula $R_nSiR^1_{4-n}$ wherein R is selected from a linear or branched $C_2$ to $C_6$ alkenyl group, a linear or branched $C_2$ to $C_6$ alkynyl group; $R^1$ is selected from hydrogen and a branched $C_1$ to $C_{10}$ alkyl group; and n is a number selected from 0, 1, 2, and 3, and a second compound comprise at least one member selected from the group consisting of the following Formulae:

IIA. a polysilane compound having a formula of $Si_xH_{2x+2}$ wherein x is a number from 2 to 6;

IIB. a compound having the formula $R^1_mSiH_{4-m}$ wherein $R^1$ is selected from hydrogen and a linear or branched $C_1$ to $C_{10}$ alkyl group; and m is a number selected from 1, 2 and 3;

IIC. a compound having the formula $SiH_3$—$R^2$—$SiH_3$ wherein $R^2$ is a linear or branched $C_1$ to $C_6$ alkylene group;

IID. a compound having the formula $R^3SiH_2$—$R^2$—$SiH_2R^4$ wherein $R^2$ is a linear or branched $C_1$ to $C_6$ alkylene group; $R^3$ is selected from hydrogen, a linear or branched $C_1$ to $C_{10}$ alkyl group, and a $C_4$ to $C_{10}$ aryl group; and $R^4$ is selected from a linear or branched $C_1$ to $C_{10}$ alkyl group;

IIE. a compound having the formula $(R^3R^4N)_nSiH_{3-n}R^1$ wherein $R^1$ is selected from hydrogen and a branched $C_1$ to $C_{10}$ alkyl group; $R^3$ is selected from hydrogen, a linear or branched $C_1$ to $C_{10}$ alkyl group, and a $C_4$ to $C_{10}$ aryl group; and $R^4$ is selected from a linear or branched $C_1$ to $C_{10}$ alkyl group;

IIF. a silacycloalkyl compound;

IIG. a trisilylamine compound or derivatives thereof;

IIH. a silazane compound having the formula of $[(R^3R^4N)_p\ SiH_{3-p}]_2NR^1$ or $[R^3_pSiH_{2-p}NR^1]_q$ wherein $R^1$ is selected from hydrogen and a linear or branched $C_1$ to $C_{10}$ alkyl group; $R^3$ is selected from hydrogen, a linear or branched $C_1$ to $C_{10}$ alkyl group, and a $C_4$ to $C_{10}$ aryl group; and $R^4$ is selected from a linear or branched $C_1$ to $C_{10}$ alkyl group; p=0, 1, 2; q=2 or 3; and IIIA. an organoaminodisilanes having the formula of $(R^3R^4N)SiH_2SiH_3$ wherein $R^3$ is selected from hydrogen, a branched $C_1$ to $C_{10}$ alkyl group, and a $C_4$ to $C_{10}$ aryl group; and $R^4$ is selected from a linear or branched $C_1$ to $C_{10}$ alkyl group; In some embodiments, $R^3$ and $R^4$ can be linked to form a ring; In other embodiments, $R^3$ and $R^4$ are not linked to form a ring.

Another embodiment of the invention relates to a film formed by the inventive method as well as a film having the previously identified characteristics.

The various embodiments of the invention can be used alone or in combinations with each other.

DETAILED DESCRIPTION OF THE INVENTION

Figure 1:
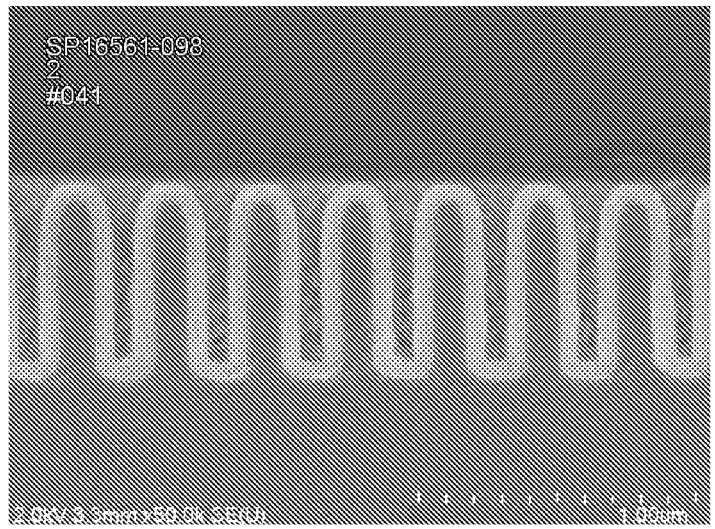
FIG. 1 (a) and FIG. 1 (b) show the cross-sectional SEM images of the flowable SiC films by tetravinylsilane (TVS) and 1,4-disilabutane, as described in Example 1. Bottom-up, seamless and void-free gap-fill was demonstrated after post-treatment.
Figure 1:
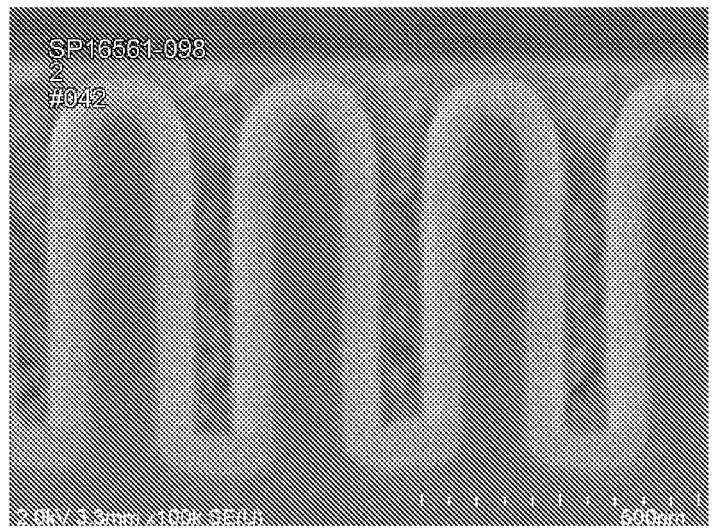

The method and compounds described herein comprises at least two silicon precursor compounds: an at least one first compound and at least one second compound.

Described herein are compositions comprising at least two precursor compounds and methods using same to deposit a flowable film via a chemical vapor deposition (CVD) process on at least a portion of a substrate having a surface feature. Films deposited by, for example, flowable chemical deposition treatment experience film shrinkage during post-treatment due to the low process temperature. Voids and seams can form in the film due to significant film shrinkage and the increase of film stress. Thus, it has been challenging to densify the film without increasing film stress or creating voids. The composition and method described herein overcomes these problems by improving the fill of at least a portion of a surface feature on a substrate by using the co-deposition of at least two precursor compounds. While not being bound by theory, it is believed that an increased amount of cross-linking can be generated by using a first compound containing unsaturated carbon bonds which break and at least partially react with a second compound having at least one Si—H bond. The reaction may happen during the deposition step, the treatment step, or both the deposition and treatment step. Thus, the improvement in cross-linking reduces the voids in the gap fill which can arise during the treatment step (e.g., thermal annealing and/or UV cure).

The method and compounds described herein comprises at least two silicon precursor compounds: an at least one first compound having an unsaturated carbon bond (e.g., a carbon-carbon double bond or a carbon-carbon triple bond) and at least one second compound having at least one Si—H bond.

The first compound is a compound having at least one carbon-carbon double bond or C—C triple bond wherein the compound is represented by the formula $R_nSiR^1_{4-n}$ wherein R is selected from a linear or branched $C_2$ to $C_6$ alkenyl group, a linear or branched $C_2$ to $C_6$ alkynyl group; $R^1$ is selected from hydrogen and a branched $C_1$ to $C_{10}$ alkyl group; and n is a number selected from 0, 1, 2, and 3. Exemplary compounds for Formula I include, but not limited to, the following:

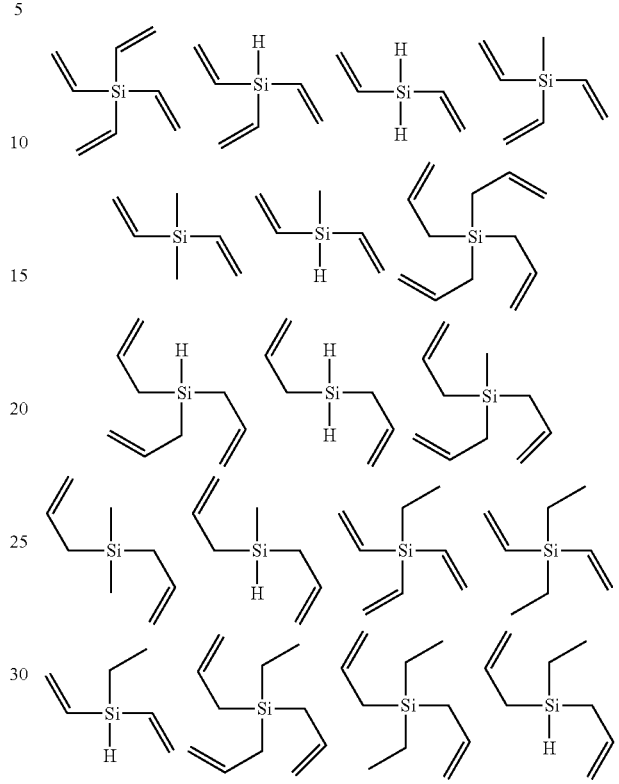

The second compound is a compound comprising at least one Si—H bond and is at least one selected from the group consisting of the following Formulae IIA to IIH and IIIA:

IIA. a polysilane compound having a formula of $Si_xH_{2x+2}$ wherein x is a number from 2 to 6;

IIB. a compound having the formula $R^1_mSiH_{4-m}$ wherein $R^1$ is selected from hydrogen and a linear or branched $C_1$ to $C_{10}$ alkyl group; and m is a number selected from 1, 2 and 3;

IIC. a compound having the formula $SiH_3$—$R^2$—$SiH_3$ wherein $R^2$ is a linear or branched $C_1$ to $C_6$ alkylene group;

IID. a compound having the formula $R^3SiH_2$—$R^2$—$SiH_2R^4$ wherein $R^2$ is a linear or branched $C_1$ to $C_6$ alkylene group; $R^3$ is selected from hydrogen, a linear or branched $C_1$ to $C_{10}$ alkyl group, and a $C_4$ to $C_{10}$ aryl group; and $R^4$ is selected from a linear or branched $C_1$ to $C_{10}$ alkyl group;

IIE. a compound having the formula $(R^3R^4N)_nSiH_{3-n}R^1$ wherein $R^1$ is selected from hydrogen and a branched $C_1$ to $C_{10}$ alkyl group; $R^3$ is selected from hydrogen, a linear or branched $C_1$ to $C_{10}$ alkyl group, and a $C_4$ to $C_{10}$ aryl group; and $R^4$ is selected from a linear or branched $C_1$ to $C_{10}$ alkyl group;

IIF. a silacycloalkyl compound;

IIG. a trisilylamine compound or derivatives thereof;

IIH. a silazane compound having the formula of $[(R^3R^4N)_p\ SiH_{3-p}]_2NR^1$ or $[R^3_pSiH_{2-p}NR^1]_q$ wherein $R^1$ is selected from hydrogen and a linear or branched $C_1$ to $C_{10}$ alkyl group; $R^3$ is selected from hydrogen, a linear or branched $C_1$ to $C_{10}$ alkyl group, and a $C_4$ to $C_{10}$ aryl group; and $R^4$ is selected from a linear or branched $C_1$ to $C_{10}$ alkyl group; p=0, 1, 2; q=2 or 3;

IIIA. an organoaminodisilanes having the formula of $(R^3R^4N)SiH_2SiH_3$ wherein $R^3$ is selected from hydrogen, a branched $C_1$ to $C_{10}$ alkyl group, and a $C_4$ to $C_{10}$ aryl group; and $R^4$ is selected from a linear or branched $C_1$ to $C_{10}$ alkyl group; In some embodiments, $R^3$ and $R^4$ can be linked to form a ring; In other embodiments, $R^3$ and $R^4$ are not linked to form a ring.

Exemplary compounds for Formula IIA include, but not limited to, disilane, trisilane, tetrasilane, pentasilane, hexasilane, and combinations thereof.

Exemplary compounds for Formula IIB include, but not limited to, the following:

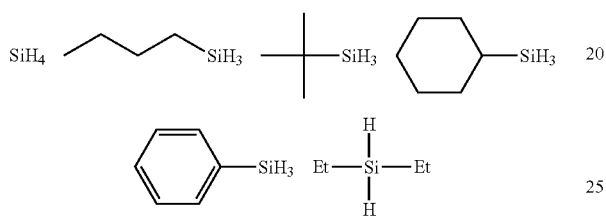

Exemplary compounds for Formula IIC include, but not limited to, the following:

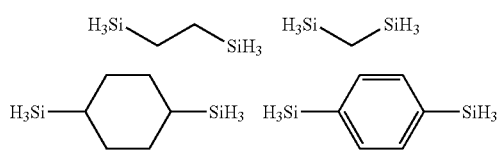

Exemplary compounds for Formula IID include, but not limited to, the following:

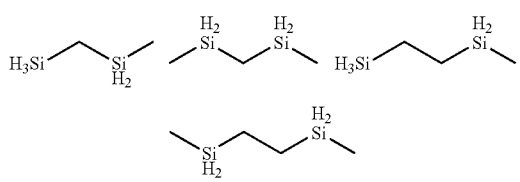

Exemplary compounds for Formula IIE include, but not limited to, the following:

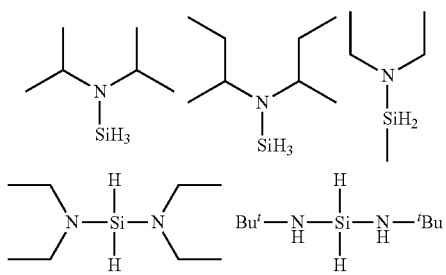

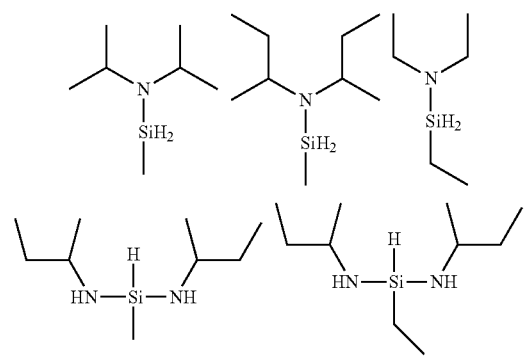

Exemplary compounds for Formula IIF include, but not limited to, the following:

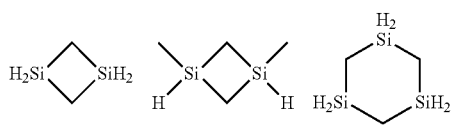

Exemplary compounds for Formula IIG include, but not limited to, the following:

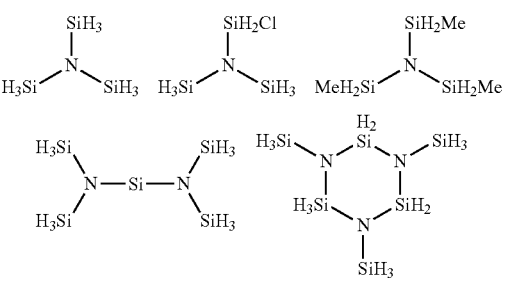

Exemplary compounds for Formula IIH include, but not limited to, the following:

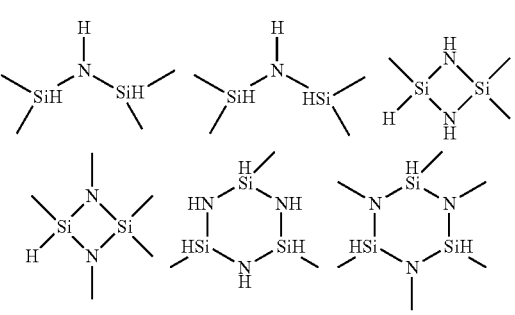

Exemplary compounds for Formula IIIA include, but not limited to, the following:

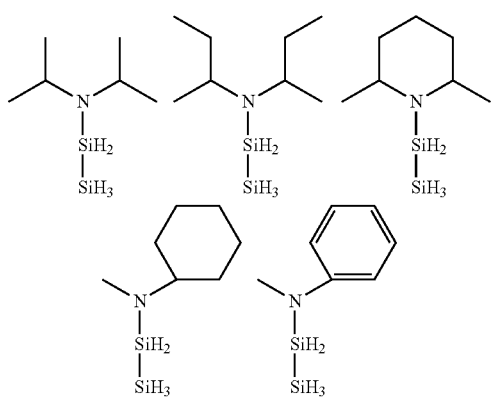

In the formulae above and throughout the description, the term "linear or branched alkyl" denotes a linear functional group having from 1 to 10, 3 to 10, or 1 to 6 carbon atoms. In the formulae above and throughout the description, the term "branched alkyl" denotes a linear functional group having from 3 to 10, or 1 to 6 carbon atoms. Exemplary linear or branched alkyl groups include, but are not limited to, methyl (Me), ethyl (Et), isopropyl ($Pr^i$), isobutyl ($Bu^i$), sec-butyl ($Bu^s$), tert-butyl ($Bu^t$), iso-pentyl, tert-pentyl (am), isohexyl, and neohexyl. In certain embodiments, the alkyl group may have one or more functional groups such as, but not limited to, an alkoxy group, a dialkylamino group or combinations thereof, attached thereto. In other embodiments, the alkyl group does not have one or more functional groups attached thereto. The alkyl group may be saturated or, alternatively, unsaturated.

In the formulae above and throughout the description, the term "cyclic alkyl" denotes a cyclic group having from 3 to 10 or 5 to 10 atoms. Exemplary cyclic alkyl groups include, but are not limited to, cyclobutyl, cyclopentyl, cyclohexyl, and cyclooctyl groups. In certain embodiments, the cyclic alkyl group may have one or more $C_1$ to $C_{10}$ linear, branched substituents, or substituents containing oxygen or nitrogen atoms. In this or other embodiments, the cyclic alkyl group may have one or more linear or branched alkyls or alkoxy groups as substituents, such as, for example, a methylcyclohexyl group or a methoxycyclohexyl group.

In the formulae above and throughout the description, the term "aryl" denotes an aromatic cyclic functional group having from 3 to 10 carbon atoms, from 5 to 10 carbon atoms, or from 6 to 10 carbon atoms. Exemplary aryl groups include, but are not limited to, phenyl, benzyl, chlorobenzyl, tolyl, and o-xylyl.

In the formulae above and throughout the description, the term "alkenyl group" denotes a group which has one or more carbon-carbon double bonds and has from 2 to 12, from 2 to 10, or from 2 to 6 carbon atoms. Exemplary alkenyl groups include, but are not limited to, vinyl or allyl groups.

The term "alkynyl group" denotes a group which has one or more carbon-carbon triple bonds and has from 2 to 12 or from 2 to 6 carbon atoms.

The term "alkylene group" denotes a group which is derived from an alkyl by removal of two hydrogen atoms. Exemplary alkylene groups include, but are not limited to, methylene (—$CH_2$—) or ethylene (—$CH_2CH_2$—) groups.

In the formulae above and through the description, the term "unsaturated" as used herein means that the functional group, substituent, ring or bridge has one or more carbon double bonds or triple bonds. An example of an unsaturated ring can be, without limitation, an aromatic ring such as a phenyl ring. The term "saturated" means that the functional group, substituent, ring or bridge does not have one or more double or triple bonds.

In certain embodiments, one or more of the alkyl group, alkenyl group, alkynyl group, aryl group, and/or cyclic alkyl group in the formulae may be "substituted" or have one or more atoms or group of atoms substituted in place of, for example, a hydrogen atom. Exemplary substituents include, but are not limited to, oxygen, sulfur, halogen atoms (e.g., F, Cl, I, or Br), nitrogen, alkyl groups, and phosphorous. In other embodiments, one or more of the alkyl group, alkenyl group, alkynyl group, aromatic and/or aryl group in the formulae may be unsubstituted.

The ratio of the inventive first and second precursors can range from about 0:5 to about 2:1 and will vary as a function of the selected first and second precursor. In one aspect of the invention, increasing the ratio of TVS to TSA can be used to reduce voiding (or increasing the density).

The silicon precursor compounds described herein may be delivered to the reaction chamber such as a CVD or ALD reactor in a variety of ways. In one embodiment, a liquid delivery system may be utilized. In an alternative embodiment, a combined liquid delivery and flash vaporization process unit may be employed, such as, for example, the turbo vaporizer manufactured by MSP Corporation of Shoreview, MN, to enable low volatility materials to be volumetrically delivered, which leads to reproducible transport and deposition without thermal decomposition of the precursor. In liquid delivery formulations, the precursors described herein may be delivered in neat liquid form, or alternatively, may be employed in solvent formulations or compositions comprising same. Thus, in certain embodiments the precursor formulations may include solvent component(s) of suitable character as may be desirable and advantageous in a given end use application to form a film on a substrate. Examples of suitable solvents can comprise at least one member selected from the group consisting of non-polar alkane based solvents such as cyclohexane and cyclohexanone.

The silicon precursor compounds are preferably substantially free of halide ions such as chloride or metal ions such as Al. As used herein, the term "substantially free" as it relates to halide ions (or halides) such as, for example, chlorides and fluorides, bromides, iodides, $Al^{3+}$ ions, $Fe^{2+}$, $Fe^{3+}$, $Ni^{2+}$, $Cr^{3+}$ means less than 5 ppm (by weight), preferably less than 3 ppm, and more preferably less than 1 ppm, and most preferably 0 ppm. Chlorides or metal ions are known to act as decomposition catalysts for silicon precursors. Significant levels of chloride in the final product can cause the silicon precursors to degrade. The gradual degradation of the silicon precursors may directly impact the film deposition process making it difficult for the semiconductor manufacturer to meet film specifications. In addition, the shelf-life or stability is negatively impacted by the higher degradation rate of the silicon precursors thereby making it difficult to guarantee a 1-2 year shelf-life. Moreover, silicon precursors are known to form flammable and/or pyrophoric gases upon decomposition such as hydrogen and silane. Therefore, the accelerated decomposition of the silicon precursors presents safety and performance concerns related to the formation of these flammable and/or pyrophoric gaseous byproducts.

The method used to form the films or coatings described herein are flowable chemical deposition processes. Examples of suitable deposition processes for the method disclosed herein include, but are not limited to, cyclic flowable chemical vapor deposition (CFCVD), or plasma enhanced flowable chemical vapor deposition (PEFCVD). As used herein, the term "flowable chemical vapor deposition processes" refers to any process wherein a substrate is exposed to one or more volatile precursors, which react and/or decompose on the substrate surface to provide flowable oligomeric silicon-containing species and then produce the solid film or material upon further treatment and, in some cases at least a portion of the oligomeric species comprises polymeric species. Although the precursors, reagents and sources used herein may be sometimes described as "gaseous", it is understood that the precursors can be either liquid or solid which are transported with or without an inert gas into the reactor via direct vaporization, bubbling or sublimation. In some case, the vaporized precursors can pass through a plasma generator. In one embodiment, the films are deposited using a plasma-based (e.g., remote generated or in situ) CVD process. The term "reactor" as used herein, includes without limitation, a reaction chamber or deposition chamber.

The compounds precursors with Formulae I and IIA-H may be delivered to the flowable chemical vapor deposition reactor in a variety of ways including but not limited to vapor draw, bubbling or direct liquid injection (DLI). In one embodiment, a liquid delivery system may be utilized. In another embodiment, reactor may be equipped with a dual plenum showerhead to keep the plasma species generated remotely separate from vapors of the precursors until they are combined in the reactor to deposit flowable liquid. In an alternative embodiment, a combined liquid delivery and flash vaporization process unit may be employed, such as, for example, the turbo vaporizer manufactured by MSP Corporation of Shoreview, MN, to enable low volatility materials to be volumetrically delivered, which leads to reproducible transport and deposition without thermal decomposition of the precursor. In liquid delivery formulations, the precursors described herein may be delivered in neat liquid form, or alternatively, may be employed in solvent formulations or compositions comprising same. Thus, in certain embodiments the precursor formulations may include solvent component(s) of suitable character as may be desirable and advantageous in a given end use application to form a film on a substrate. In some embodiments, the two precursors with Formulae I and IIA-H can be delivered with different injection inlet to avoid reaction between the two precursors prior to entering reactor chamber. In another embodiment, the two or more precursors with Formulae I and IIA-H can be pre-mixed if they are compatible and then delivered into the reactor chamber using DLI method.

In certain embodiments, the substrate may be exposed to one or more pre-deposition treatments such as, but not limited to, a plasma treatment, thermal treatment, chemical treatment, ultraviolet light exposure, electron beam exposure, and combinations thereof to affect one or more properties of the films. These pre-deposition treatments may occur under an atmosphere selected from inert, oxidizing, and/or reducing.

Energy is applied to the at least one of the compound, nitrogen-containing source, oxygen source, other precursors or combination thereof to induce reaction and to form the silicon-containing film or coating on the substrate. Such energy can be provided by, but not limited to, thermal, plasma, pulsed plasma, helicon plasma, high density plasma, inductively coupled plasma, X-ray, e-beam, photon, remote plasma methods, and combinations thereof. In certain embodiments, a secondary RF frequency source can be used to modify the plasma characteristics at the substrate surface. In embodiments wherein the deposition involves plasma, the plasma-generated process may comprise a direct plasma-generated process in which plasma is directly generated in the reactor, or alternatively a remote plasma-generated process in which plasma is generated outside of the reactor and supplied into the reactor.

As previously mentioned, the method deposits a film upon at least a portion of the surface of a substrate comprising a surface feature. The substrate is placed into the reactor and the substrate is maintained at one or more temperatures ranging from about −20° C. to about 400° C. In one particular embodiment, the temperature of the substrate is less than the walls of the chamber. The substrate temperature is held at a temperature below 100° C., preferably at a temperature below 25° C. and most preferably below 10° C. and greater than −20° C.

As previously mentioned, the substrate comprises one or more surface features. In one particular embodiment, the surface feature(s) have a width of 1 μm in width or less, or 500 nm in width or less, or 50 nm in width or less, or 10 nm in width. In this or other embodiments, the aspect ratio (the depth to width ratio) of the surface features, if present, is 0.1:1 or greater, or 1:1 or greater, or 10:1 or greater, or 20:1 or greater, or 40:1 or greater. The substrate may be a single crystal silicon wafer, a wafer of silicon carbide, a wafer of aluminum oxide (sapphire), a sheet of glass, a metallic foil, an organic polymer film or may be a polymeric, glass, silicon or metallic 3-dimensional article. The substrate may be coated with a variety of materials well known in the art including films of silicon oxide, silicon nitride, amorphous carbon, silicon oxycarbide, silicon oxynitride, silicon carbide, gallium arsenide, gallium nitride and the like. These coatings may completely coat the substrate, may be in multiple layers of various materials and may be partially etched to expose underlying layers of material. The surface may also have on it a photoresist material that has been exposed with a pattern and developed to partially coat the substrate.

In one aspect of the invention, the substrate comprises at least one member selected from the group consisting of Si, $SiO_x$, SiN, SiGe, SiOC and SiON. In another aspect of the invention, the inventive silicon containing film can be employed as a hard mask and provide etch selectivity to a photoresist. In a further aspect of the invention, the inventive silicon containing film functions as a dielectric film between conductive materials, as a barrier between conductive and other dielectric, or as a film within a sandwich dielectric.

In certain embodiments, the reactor is at a pressure below atmospheric pressure or 750 torr ($10^5$ Pascals (Pa)) or less, or 100 torr (13332 Pa) or less. In other embodiments, the pressure of the reactor is maintained at a range of about 0.1 torr (13 Pa) to about 10 torr (1333 Pa).

In one particular embodiment, the introducing step, wherein the at least one compound and a plasma are introduced into the reactor, is conducted at one or more temperatures ranging from about −20 to about 400° C., or from −20 to about 100° C., or from −20 to about 40° C. In these or other embodiments, the substrate comprises a semiconductor substrate comprising a surface feature. The plasma comprising nitrogen can be selected from the group consisting of nitrogen plasma, nitrogen/hydrogen plasma, nitrogen/helium plasma, nitrogen/argon plasma, ammonia plasma, ammonia/helium plasma, ammonia/argon plasma, ammonia/nitrogen plasma, $NF_3$, $NF_3$ plasma, organic amine plasma, and mixtures thereof. The at least one compound and nitrogen source react and form a silicon nitride film (which is non-stoichiometric) or a silicon carbonitride film on at least a portion of the surface feature and substrate. The term "organic amine" as used herein describes an organic compound that has at least one nitrogen atom. Examples of organoamine, but are not limited to, methylamine, ethylamine, propylamine, iso-propylamine, tert-butylamine, sec-butylamine, tert-amylamine, ethylenediamine, dimethylamine, trimethylamine, diethylamine, pyrrole, 2,6-dimethylpiperidine, di-n-propylamine, di-iso-propylamine, ethylmethylamine, N-methylaniline, pyridine, and triethylamine.

In another embodiment, the plasma source is selected from but not limited to the group consisting of a carbon source plasma, including a hydrocarbon plasma, a plasma comprising hydrocarbon and helium, a plasma comprising hydrocarbon and argon, carbon dioxide plasma, carbon monoxide plasma, a plasma comprising hydrocarbon and hydrogen, a plasma comprising hydrocarbon and a nitrogen source, a plasma comprising hydrocarbon and an oxygen source, and mixture thereof. The at least one compound and carbon source react and form a silicon carbide film (which is non-stoichiometric), or a silicon carbonitride film, or a silicon oxynitride film, or a silicon oxycarbide film, or a silicon oxycarbonitrde film on at least a portion of the surface feature and substrate.

In a different embodiment, the plasma source is selected from but not limited to hydrogen plasma, helium plasma, argon plasma, xenon plasma, and mixture thereof. The at least one compound and plasma react and form a silicon nitride film, or a silicon carbide film, or a silicon carbonitride film on at least a portion of the surface feature and substrate.

In certain embodiments, after the silicon containing film is deposited, the substrate is optionally treated with an oxygen-containing source under certain process conditions sufficient to make the silicon nitride film form a silicon oxide or a silicon oxynitride or carbon doped silicon oxide film. The oxygen-containing source can be selected from the group consisting of water ($H_2O$), oxygen ($O_2$), oxygen plasma, ozone ($O_3$), NO, $N_2O$, carbon monoxide (CO), carbon dioxide ($CO_2$), $N_2O$ plasma, carbon monoxide (CO) plasma, carbon dioxide ($CO_2$) plasma, and combinations thereof.

In certain embodiments, the flowable liquid or oligomer is treated at one or more temperatures ranging from about 100° C. to about 1000° C. to densify at least a portion of the materials.

In some embodiments, the post thermal treatment materials are exposed to a plasma, infrared lights, chemical treatment, an electron beam, or UV light to form a dense film.

The above steps define one cycle for the methods described herein; and the cycle can be repeated until the desired thickness of a silicon-containing film is obtained. In this or other embodiments, it is understood that the steps of the methods described herein may be performed in a variety of orders, may be performed sequentially or concurrently (e.g., during at least a portion of another step), and any combination thereof. The respective step of supplying the compounds and other reagents may be performed by varying the duration of the time for supplying them to change the stoichiometric composition of the resulting silicon-containing film.

In one aspect, there is provided a method for depositing a silicon-containing film, the method comprising:

placing a substrate comprising a surface feature into a reactor which is at one or more temperatures ranging from −20° C. to about 400° C.;

introducing into the reactor an at least one first compound having at least one carbon-carbon double bond or carbon-carbon triple bonds wherein the first compound having the formula $R_nSiR^1_{4-n}$ wherein R is selected a linear or branched $C_2$ to $C_6$ alkenyl group, a linear or branched $C_2$ to $C_6$ alkynyl group; $R^1$ is selected from hydrogen and a linear or branched $C_1$ to $C_{10}$ alkyl group; and n is a number selected form from 0, 1, 2, and 3;

introducing into the reactor a second compound having at least one Si—H bond wherein the at least one second compound is selected from the group consisting of the following Formula IIA to IIH and III:

IIA. a polysilane compound having a formula of $Si_xH_{2x+2}$ wherein x is a number from 2 to 6;

IIB. a compound having the formula $R^1_mSiH_{4-m}$ wherein $R^1$ is selected from hydrogen and a linear or branched $C_1$ to $C_{10}$ alkyl group; and m is a number selected from 1, 2 and 3;

IIC. a compound having the formula $SiH_3$—$R^2$—$SiH_3$ wherein $R^2$ is a linear or branched $C_1$ to $C_6$ alkylene group;

IID. a compound having the formula $R^3SiH_2$—$R^2$—$SiH_2R^4$ wherein $R^2$ is a linear or branched $C_1$ to $C_6$ alkylene group; $R^3$ is selected from hydrogen, a linear or branched $C_1$ to $C_{10}$ alkyl group, and a $C_4$ to $C_{10}$ aryl group; and $R^4$ is selected from a linear or branched $C_1$ to $C_{10}$ alkyl group;

IIE. a compound having the formula $(R^3R^4N)_nSiH_{3-n}R^1$ wherein $R^1$ is selected from hydrogen and a linear or branched $C_1$ to $C_{10}$ alkyl group; $R^3$ is selected from hydrogen, a linear or branched $C_1$ to $C_{10}$ alkyl group, and a $C_4$ to $C_{10}$ aryl group; and $R^4$ is selected from a linear or branched $C_1$ to $C_{10}$ alkyl group;

IIF. a silacycloalkyl compound;

IIG. a trisilylamine compound or derivatives thereof; and

IIH. a silazane compound having the formula of $[(R^3R^4N)_p SiH_{3-p}]_2NR^1$ or $[R^3_pSiH_{2-p}NR^1]_q$ wherein $R^1$ is selected from hydrogen and a linear or branched $C_1$ to $C_{10}$ alkyl group; $R^3$ is selected from hydrogen, a branched $C_1$ to $C_{10}$ alkyl group, and a $C_4$ to $C_{10}$ aryl group; and $R^4$ is selected from a linear or branched $C_1$ to $C_{10}$ alkyl group; p=0, 1, 2; q=2 or 3; and IIIA. An organoaminodisilanes having the formula of $(R^3R^4N)SiH_2SiH_3$ wherein $R^3$ is selected from hydrogen, a branched $C_1$ to $C_{10}$ alkyl group, and a $C_4$ to $C_{10}$ aryl group; and $R^4$ is selected from a linear or branched $C_1$ to $C_{10}$ alkyl group.

providing a plasma source into the reactor to at least partially react the first and second compounds to form a flowable liquid or oligomer wherein the flowable liquid or oligomer at least partially fills a portion of the surface feature. The above steps define one cycle for the methods described herein; and the cycle can be repeated until the desired thickness of a silicon-containing film is obtained. In this or other embodiments, it is understood that the steps of the methods described herein may be performed in a variety of orders, may be performed sequentially or concurrently (e.g., during at least a portion of another step), and any combination thereof. The respective step of supplying the compounds and other reagents may be performed by varying the duration of the time for supplying them to change the stoichiometric composition of the resulting silicon-containing film.

The plasma comprising nitrogen can be selected from the group consisting of nitrogen plasma, nitrogen/hydrogen plasma, nitrogen/helium plasma, nitrogen/argon plasma, ammonia plasma, ammonia/helium plasma, ammonia/argon plasma, ammonia/nitrogen plasma, $NF_3$, $NF_3$ plasma, organic amine plasma, and mixtures thereof.

In another embodiment, the plasma source is selected from but not limited to the group consisting of a carbon source plasma, including a hydrocarbon plasma, a plasma comprising hydrocarbon and helium, a plasma comprising hydrocarbon and argon, carbon dioxide plasma, carbon monoxide plasma, a plasma comprising hydrocarbon and hydrogen, a plasma comprising hydrocarbon and a nitrogen source, a plasma comprising hydrocarbon and an oxygen source, and mixture thereof.

In any of the above or in an alternative embodiment, the plasma source is selected from but not limited to hydrogen plasma, helium plasma, argon plasma, xenon plasma, and mixture thereof. The at least one compound and plasma react and form a silicon nitride film, or a silicon carbide film, or a silicon carbonitride film on at least a portion of the surface feature and substrate.

In certain embodiments, after the silicon containing film is deposited, the substrate is optionally treated with an oxygen-containing source under certain process conditions sufficient to make the silicon nitride film form a silicon oxide or a silicon oxynitride or carbon doped silicon oxide film. The oxygen-containing source can be selected from the group consisting of water ($H_2O$), oxygen ($O_2$), oxygen plasma, ozone ($O_3$), NO, $N_2O$, carbon monoxide (CO), carbon dioxide ($CO_2$), $N_2O$ plasma, carbon monoxide (CO) plasma, carbon dioxide ($CO_2$) plasma, and combinations thereof.

In any of the above or in an alternative embodiment, the flowable liquid or oligomer is treated at one or more temperatures ranging from about 100° C. to about 1000° C. to density at least a portion of the materials.

In some embodiments, the post thermal treatment materials are exposed to a plasma, infrared lights, chemical treatment, an electron beam, or UV light to form a dense film. In one embodiment of the invention, a post treatment comprising exposure to UV light exposure is conducted under conditions to emit ethylene and silane gaseous by-products.

The following Examples are provided to illustrate certain embodiments of the invention and shall not limit the scope of the appended claims.

EXAMPLES

Flowable chemical vapor deposition (FCVD) films were deposited onto medium resistivity (8-12 Ωcm) single crystal silicon wafer substrates and Si pattern wafers. In certain examples, the resultant silicon-containing films or coatings can be exposed to a pre-deposition treatment such as, but not limited to, a plasma treatment, thermal treatment, chemical treatment, ultraviolet light exposure, Infrared exposure, electron beam exposure, and/or other treatments to affect one or more properties of the film.

Depositions on a modified FCVD chamber on an Applied Materials Precision 5000 system, can be performed using either a silane or a TEOS process kit. The chamber has direct liquid injection (DLI) delivery capability. The precursors are liquids with delivery temperatures dependent on the precursor's boiling point. To deposit initial flowable nitride films, typical liquid precursor flow rates were 100-5000 mg/min, in-situ plasma power density was 0.25-3.5 $W/cm^2$, pressure was 0.75-12 Torr. To densify the as-deposit flowable films, the films were thermally annealed and/or UV cured in vacuum using the modified PECVD chamber at 100~1000° C., preferably 300~400° C. Thickness and refractive index (RI) at 632 nm were measured by a SCI reflectometer or Woollam ellipsometer. Typical film thickness ranged from 10 to 2000 nm. Bonding properties and hydrogen content (Si—H, C—H and N—H) of the silicon-based films were measured and analyzed by a Nicolet transmission Fourier transform infrared spectroscopy (FTIR) tool. All density measurements were accomplished using X-ray reflectivity (XRR). X-ray Photoelectron Spectroscopy (XPS) and Secondary ion mass spectrometry (SIMS) analysis were performed to determine the elemental composition of the films. The flowability and gap fill effects on patterned wafers were observed by a cross-sectional Scanning Electron Microscopy (SEM) using a Hitachi S-4700 system at a resolution of 2.0 nm.

Flowable CVD depositions were conducted using a design of experiment (DOE) methodology. The experimental design includes: two precursor flows from 100 to 5000 mg/min, preferably 500 to 2000 mg/min; $NH_3$ flow from 0 sccm to 1000 sccm, preferably 0 to 500 sccm; pressure from 0.75 to 12 Torr, preferably 6 to 10 Torr; RF power (13.56 MHz) 50 to 1000 W, preferably 100~500 W; Low-frequency (LF) power 0 to 100 W; and deposition temperature ranged from −20 to 400° C., preferably −20 to 40° C.

Example 1: Deposition of Flowable Silicon Carbide Films Using Tetravinylsilane (TVS, Formula I) and 1,4-Disilabutane (DSB, Formula IID)

In the experiment, the process conditions used to deposit flowable silicon carbide (SiC) films with the most favorable film properties are as follows: power=150 W, spacing=250 mils, pressure=8 Torr, Temperature=35~40° C., TVS=500 mg/min, 1,4-disilabutane=750 mg/min, He=200 sccm. The flowable film was thermally annealed at 300° C. for 5 min, followed by 400° C. UV cure for 1, 3, 5 and 10 minutes. The refractive index and film density increased with the UV treatment time. Cross-sectional SEM indicates that bottom-up, seamless and void-free gap-fill was achieved by the co-deposition of the precursor compounds TVS and 1,4-disilabutane, as shown in FIG. 1 (a) and FIG. 1 (b). The film was thermally annealed for 5 min at 300° C. and UV cured for 1 min at 400° C. The flowable SiC film showed good stability by ambient exposure. Stability is measured by detecting changes to film thickness (e.g., as measured by refractive index) wherein a film with poor stability has a reduced thickness by being oxidized when exposed to ambient moisture and oxygen levels. There was no change in thickness or refractive index.

Example 2: Deposition of Flowable Silicon Carbonitride Films Using Tetravinylsilane (TVS, Formula I) and Trisilylamine (TSA, Formula IIG)

Figure 2:
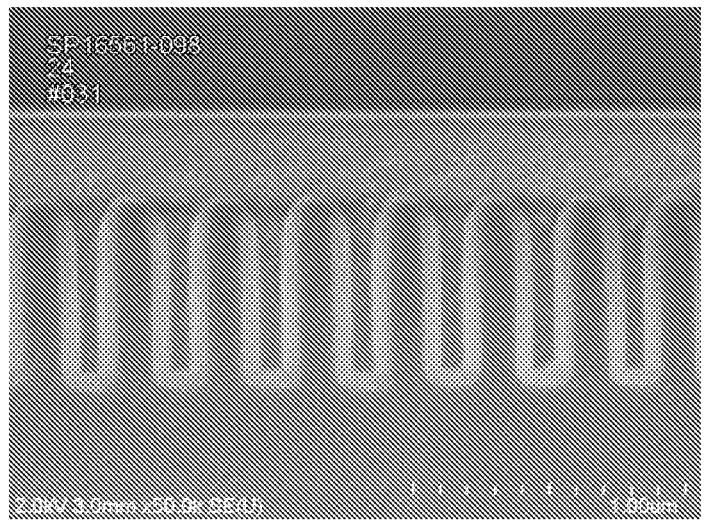
FIG. 2 (a) and FIG. 2 (b) show the cross-sectional SEM images of the flowable SiC films by tetravinylsilane (TVS) and trisilylamine (TSA), as described in Example 2. Bottom-up, seamless and void-free gap-fill was demonstrated after post-treatment.
Figure 2:
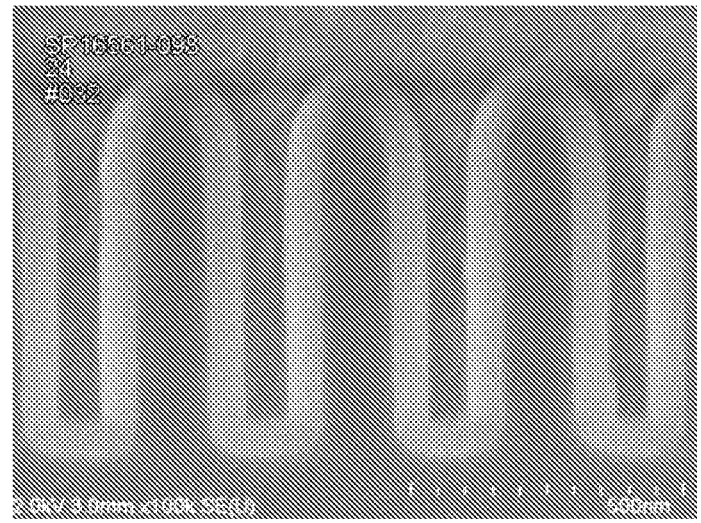

In this experiment, the process conditions used to deposit flowable silicon carbonitride (SiCN) films with the most favorable film properties are as follows: power=200 W, spacing=300 mils, pressure=6 Torr, temperature=30° C., TVS=1700 mg/min, TSA=1000 mg/min, He=200 sccm, $NH_3$=450 sccm. The flowable film was thermally annealed at 300° C. for 5 min, followed by 400° C. UV cure for 1, 3, 5 and 10 minutes. The refractive index and film density increase with the UV time. Cross-sectional SEM indicates that bottom-up, seamless and void-free gap-fill was achieved by the co-deposition of a first precursor TVS and second precursor TSA, as shown in FIG. 2 (a) and FIG. 2 (b). The film was thermally annealed at 300° C. for 5 min and UV cured at 400° C. for 10 min. The flowable SiCN film showed good stability by ambient exposure. There was no change in thickness or refractive index. The WER was also tested by dipping the film into dilute HF solutions. The flowable SiCN films showed etch resistance of HF solutions.

Figure 3:
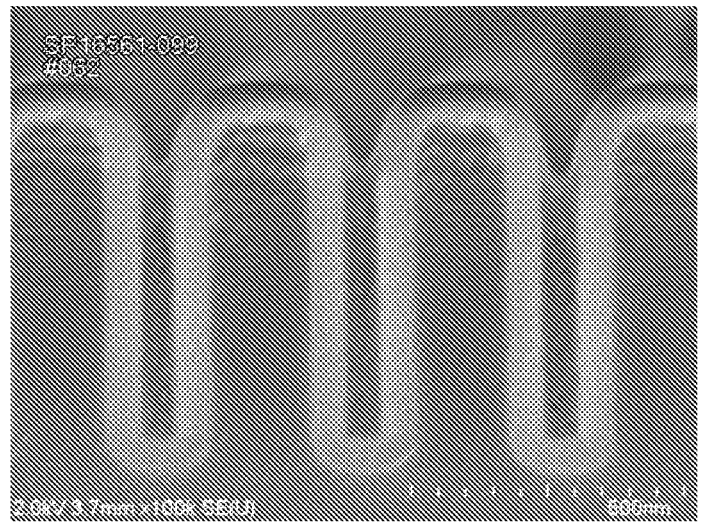
FIG. 3 (a)~(c) show the cross-sectional SEM images with 1, 2 and 3 cycles of processing, as described in Example 3. A cyclic process was demonstrated to fill the gaps.
Figure 3:
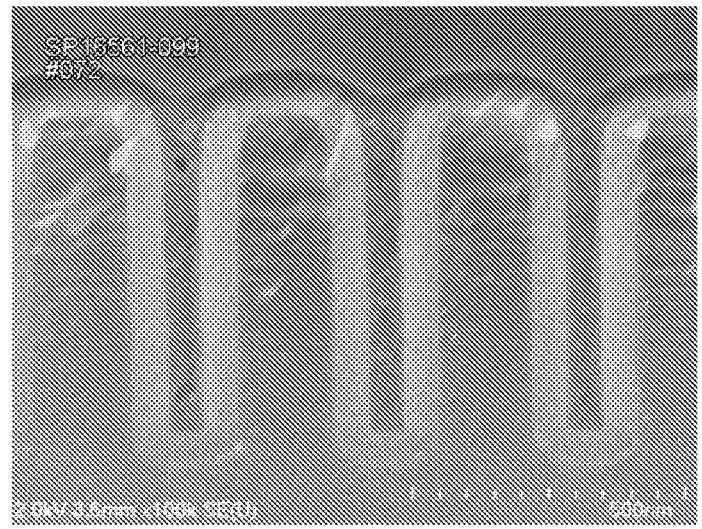
Figure 3:
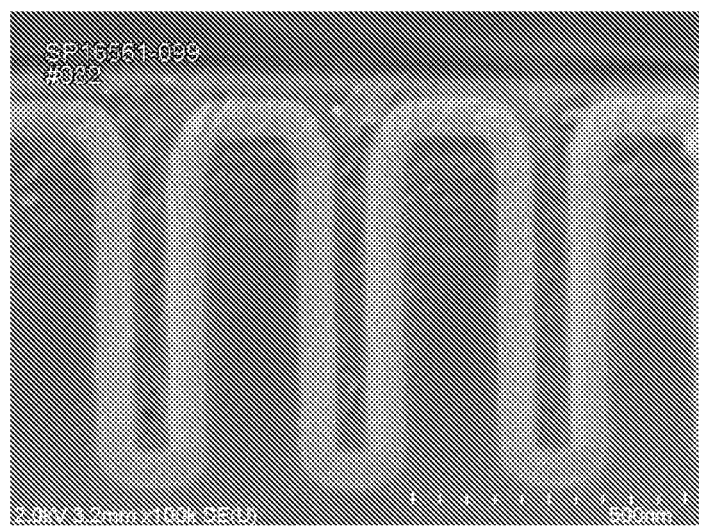

Example 3: Deposition of Flowable Silicon Carbonitride Films Using Tetravinylsilane (TVS, Formula I) and Trisilylamine (TSA, Formula IIG) by a Cyclic Process This experiments used the deposition conditions in Example 2. The deposition time was reduced from 10 sec to 1.5 sec. FIGS. 3 (a)~3 (c) exhibit the gap-fill effect after 1, 2 and 3 cycles of processing. In every cycle, the film was deposited, thermally annealed at 300° C. for 5 min, and UV cured at 400° C. for 10 min. One cycle of processing can fill 80~90% of the gaps, as shown in FIG. 3 (a). By 3 cycles of processing, the gaps were completely filled and a layer of films started to grow on the top of the structure.

Example 4: Deposition of Flowable Silicon Carbonitride Films Using Tetravinylsilane (TVS, Formula I) and Di-Iso-Propylaminosilane (DIPAS, Formula IIE)

Figure 4:
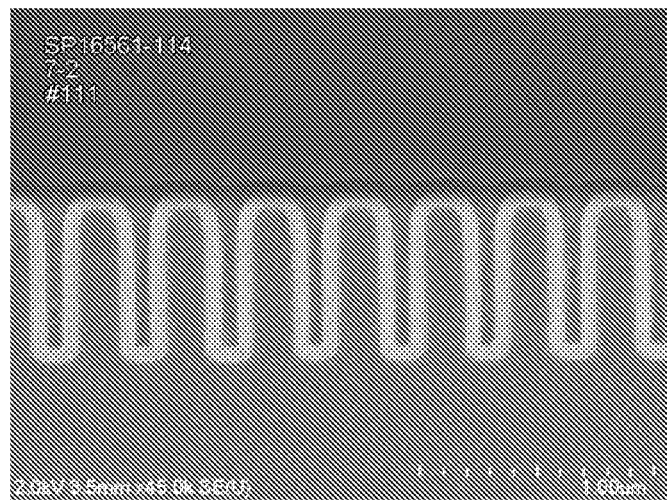
FIG. 4 shows cross-sectional SEM indicates that bottom-up, seamless and void-free gap-fill was achieved by the co-deposition of a first precursor tetravinylsilane (TVS) and second precursor di-iso-propylaminosilane (DIPAS) as described in Example 4.

In this experiment, TVS and DIPAS were co-deposited for flowable SiCN film. The favorable deposition conditions included: power=200~400 W, spacing=300 mils, pressure=6 Torr, temperature=25~30° C., TVS=1000 mg/min, DIPAS=1000~1500 mg/min, He=200 sccm, $NH_3$=450~1000 sccm. Wet and flowable films were deposited under these conditions. The films were then thermally annealed at 300° C. for 5 min. Cross-sectional SEM indicates that bottom-up, seamless and void-free gap-fill was achieved by the co-deposition of a first precursor TVS and second precursor DIPAS, as shown in FIG. 4.

Example 5: Deposition of Flowable Silicon Carbonitride Films Using Trivinylmethylsilane (TVMS, Formula I) and Trisilylamine (TSA, Formula IIG)

Figure 5:
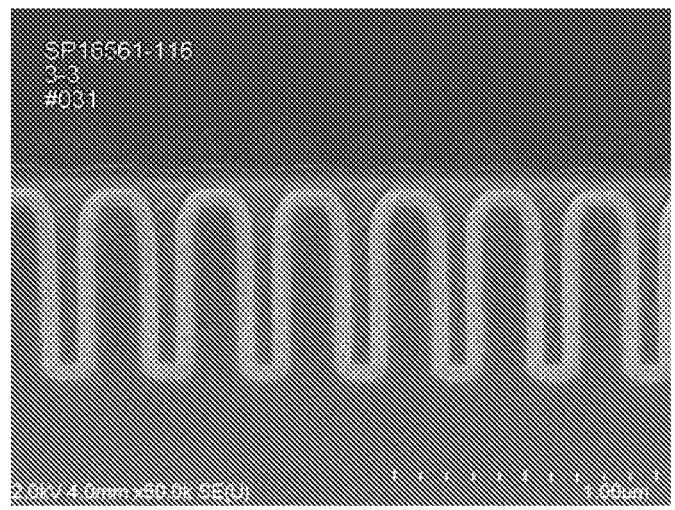
FIG. 5 shows cross-sectional SEM indicates that bottom-up, seamless and void-free gap-fill was achieved by the co-deposition of a first precursor trivinylmethylsilane (TVMS) and second precursor trisilylamine (TSA) as described in Example 5.

In this experiment, TVMS and TSA were co-deposited for flowable SiCN film. The favorable deposition conditions included: power=200 W, spacing=300 mils, pressure=6 Torr, temperature=25~30° C., TSA=1000 mg/min, TVMS=1000~1500 mg/min, He=200 sccm, $NH_3$=600~1200 sccm. Wet and flowable films were deposited under these conditions. The films were then thermally annealed at 300° C. for 5 min and UV cured at 400° C. for 10 min. Cross-sectional SEM indicates that bottom-up, seamless and void-free gap-fill was achieved by the co-deposition of a first precursor TVMS and second precursor TSA, as shown in FIG. 5. The replacement of a vinyl group in TVS with a methyl group in TVMS did not compromise the flowability or gap-fill results. However, without forming cross-linking, the film deposited by TVMS and TSA has lower density than that by TVS+TSA.

Example 6: Deposition of Flowable Silicon Carbonitride Films Using Trivinylmethylsilane (TVMS, Formula I) and 1,4-Disilabutane (DSB, Formula IIC)

Figure 6:
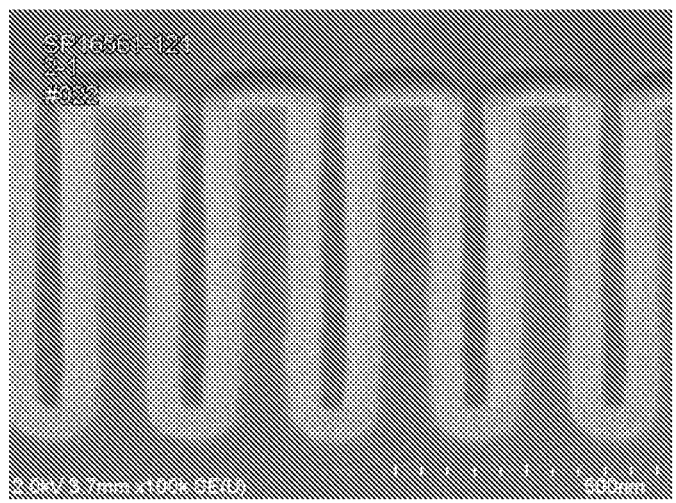
FIG. 6 shows cross-sectional SEM indicates that bottom-up, seamless and void-free gap-fill was achieved by the co-deposition of a first precursor trivinylmethylsilane (TVMS) and second precursor 1,4-disilabutane (DSB) as described in Example 6.

In this experiment, TVMS and DSB were co-deposited for flowable SiC film. The favorable deposition conditions included: power=200~400 W, spacing=300 mils, pressure=6 Torr, temperature=25~30° C., DSB=1000 mg/min, TVMS=1000~1500 mg/min, He=200 sccm, $NH_3$=600~1200 sccm. Wet and flowable films were deposited under these conditions. The films were then thermally annealed at 300° C. for 5 min. Cross-sectional SEM indicates that bottom-up, seamless and void-free gap-fill was achieved by the co-deposition of a first precursor TVMS and second precursor DSB, as shown in FIG. 6.

Example 7: Deposition of Flowable Silicon Carbonitride Films Using Tetravinylsilane (TVS, Formula I) and N,N'-Disilyltrisilazane (Formula IIG)

Figure 7:
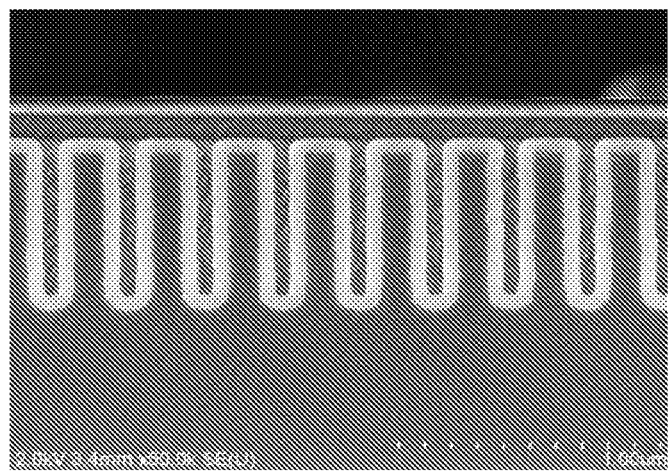
FIG. 7 show cross-sectional SEM indicates that bottom-up, seamless and void-free gap-fill was achieved by the co-deposition of a first precursor tetravinylsilane (TVS) and second precursor N,N'-disilyltrisilazane as described in Example 7.

In this experiment, TVS and TSA dimer were co-deposited for flowable SiCN film. The favorable deposition conditions included: power=150~300 W, spacing=200~400 mils, pressure=6 Torr, temperature=25~30° C., TSA dimer=1000~1500 mg/min, TVS=900~1300 mg/min, He=200 sccm, $NH_3$=600~1200 sccm. Wet and flowable films were deposited under these conditions. The films were then thermally annealed at 300° C. for 5 min and UV cured at 400° C. for 10 min. Cross-sectional SEM indicates that bottom-up, seamless and void-free gap-fill was achieved by the co-deposition of a first precursor TVS and second precursor TSA dimer, as shown in FIG. 7. Comparing to the combination of TVS and TSA, the combination of TVS and TSA dimer demonstrated higher film density (>1.8 g/cm$^3$), higher N content (18~19%) and lower C content (36~37%).

Example 8: Deposition of Flowable Silicon Carbonitride Films Using Tetravinylsilane (TVS, Formula I) and Di-Iso-Propylaminodisilane (DIPADS, Formula IIIA)

In this experiment, TVS and DIPADS were co-deposited for flowable SiCN film. The favorable deposition conditions included: power=200~400 W, spacing=300 mils, pressure=6 Torr, temperature=25~30° C., TVS=1000~1500 mg/min, DIPADS=1000~1500 mg/min, He=200 sccm, $NH_3$=500~1000 sccm. Wet and flowable films were deposited under these conditions. The films were then thermally annealed at 300° C. for 5 min and UV cured at 400° C. for 10 min. Cross-sectional SEM indicates that bottom-up, seamless and void-free gap-fill was achieved by the co-deposition of a first precursor TVS and second precursor DIPADS.

Although certain principles of the invention have been described above in connection with aspects or embodiments, it is to be clearly understood that this description is made only by way of example and not as a limitation of the scope of the invention.

We claim:
1. A method of depositing a silicon-containing film by a flowable chemical vapor deposition process, comprising:
   placing a substrate comprising a surface feature into a deposition chamber, the deposition chamber at a first temperature ranging from −20° C. to about 100° C.;
   introducing a mixture into the deposition chamber, the mixture consisting of a first silicon-containing compound and a second silicon-containing compound;
   the first silicon-containing compound having at least one carbon-carbon double bond and selected from the group consisting of tetravinylsilane and trivinylmethylsilane, and;

the second silicon-containing compound having at least one Si—H bond and being a compound having a formula of SiH$_3$—R$^2$—SiH$_3$ wherein R$^2$ is a linear or branched C$_1$ to C$_6$ alkylene group;

exposing the mixture to an in-situ plasma in the deposition chamber, thereby inducing a reaction between the first silicon-containing compound, and the second silicon-containing compound, and thus creating a flowable liquid, or oligomer, made from the first silicon-containing compound, and the second silicon-containing compound; and permitting the flowable liquid, or oligomer, to at least partially fill the surface feature and thus form the silicon-containing film.

2. The method of depositing a silicon-containing film by a flowable chemical vapor deposition process according to claim 1, wherein the mixture further comprises an inert gas selected from the group consisting of helium, argon, xenon, and mixtures thereof, and wherein atoms of the inert gas are not incorporated into the flowable liquid, or oligomer, made from the first silicon-containing compound, and the second silicon-containing compound, after exposure to the in-situ plasma in the deposition chamber, thereby creating a silicon-containing film comprising silicon and carbon.

3. The method of depositing a silicon-containing film by a flowable chemical vapor deposition process according to claim 2, further comprising changing the temperature of the deposition chamber to a second temperature ranging from 100° C. to about 1000° C. to densify the silicon-containing film.

4. The method of depositing a silicon-containing film by a flowable chemical vapor deposition process according to claim 3, further comprising exposing the silicon-containing film to a further treatment selected from the group consisting of a plasma, infrared light, chemical treatment, an electron beam, UV light, or combinations thereof to form a dense film.

5. The method of depositing a silicon-containing film by a flowable chemical vapor deposition process according to claim 4, wherein the film has at least one of the following characteristics i) a film tensile stress ranging from about 150 to about 190 MPa after a UV cure, and ii) a density ranging from about 1.35 to about 2.10 g/cm$^3$.

6. The method of depositing a silicon-containing film by a flowable chemical vapor deposition process according to claim 2, wherein a pressure of the deposition chamber is less than, or equal to, 100 torr.

7. The method of depositing a silicon-containing film by a flowable chemical vapor deposition process according to claim 1, wherein the mixture further comprises a nitrogen source selected from the group consisting of N$_2$, ammonia, NF$_3$, an organoamine, and mixtures thereof, and wherein nitrogen atoms of the nitrogen source are incorporated into the flowable liquid, or oligomer, made from the first silicon-containing compound, and the second silicon-containing compound, after exposure to the in-situ plasma in the deposition chamber, thereby creating a silicon-containing film comprising silicon, carbon, and nitrogen.

8. The method of depositing a silicon-containing film by a flowable chemical vapor deposition process according to claim 1, wherein the mixture further comprises an oxygen source selected from the group consisting of water, oxygen, ozone, nitric oxide, nitrous oxide, carbon monoxide, carbon dioxide, and combinations thereof, and wherein oxygen atoms of the oxygen source are incorporated into the flowable liquid, or oligomer, made from the first silicon-containing compound, and the second silicon-containing compound, after exposure to the in-situ plasma in the deposition chamber, thereby creating a silicon-containing film comprising silicon, carbon, and oxygen.

9. The method of depositing a silicon-containing film by a flowable chemical vapor deposition process according to claim 1, wherein the mixture further comprises an a remote plasma comprising an inert gas selected from the group consisting of helium, argon, xenon, and mixtures thereof, and wherein atoms of the inert gas are not incorporated into the flowable liquid, or oligomer, made from the first silicon-containing compound, and the second silicon-containing compound, after exposure to the in-situ plasma and the remote plasma in the deposition chamber, thereby creating a silicon-containing film comprising silicon and carbon.

10. The method of depositing a silicon-containing film by a flowable chemical vapor deposition process according to claim 1, wherein the mixture further comprises a remote plasma comprising a nitrogen source selected from the group consisting of N$_2$, ammonia, NF$_3$, an organoamine, and mixtures thereof, and wherein nitrogen atoms of the nitrogen source are incorporated into the flowable liquid, or oligomer, made from the first silicon-containing compound, and the second silicon-containing compound, after exposure to the in-situ plasma and the remote plasma in the deposition chamber, thereby creating a silicon-containing film comprising silicon, carbon, and nitrogen.

11. The method of depositing a silicon-containing film by a flowable chemical vapor deposition process according to claim 1, wherein the mixture further comprises a remote plasma comprising an oxygen source selected from the group consisting of water, oxygen, ozone, nitric oxide, nitrous oxide, carbon monoxide, carbon dioxide, and combinations thereof, and wherein oxygen atoms of the oxygen source is incorporated into the flowable liquid, or oligomer, made from the first silicon-containing compound, and the second silicon-containing compound, after exposure to the in-situ plasma and the remote plasma in the deposition chamber, thereby creating a silicon-containing film comprising silicon, carbon, and oxygen.

12. The method of depositing a silicon-containing film by a flowable chemical vapor deposition process according to claim 1, wherein the second silicon-containing compound is selected from the group consisting of:

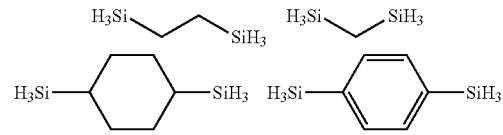

13. The method of depositing a silicon-containing film by a flowable chemical vapor deposition process according to claim 12, wherein the second silicon-containing compound is 1,4-disilabutane.

14. The method of depositing a silicon-containing film by a flowable chemical vapor deposition process according to claim 13, wherein the first silicon-containing compound consists of tetravinylsilane.

15. The method of depositing a silicon-containing film by a flowable chemical vapor deposition process according to claim 13, wherein the first silicon-containing compound consists of trivinylmethylsilane.

* * * * *